US009646863B2

(12) United States Patent
Aoki et al.

(10) Patent No.: US 9,646,863 B2
(45) Date of Patent: May 9, 2017

(54) MULTILAYER STYRENIC RESIN SHEET

(75) Inventors: Yutaka Aoki, Isesaki (JP); Atsushi Takei, Isesaki (JP); Yasushi Hirokawa, Isesaki (JP); Yusuke Masuda, Isesaki (JP)

(73) Assignee: DENKA COMPANY LIMITED, Tokyo (JP)

( * ) Notice: Subject to any disclaimer, the term of this patent is extended or adjusted under 35 U.S.C. 154(b) by 658 days.

(21) Appl. No.: 13/979,422

(22) PCT Filed: Jan. 16, 2012

(86) PCT No.: PCT/JP2012/050739
§ 371 (c)(1),
(2), (4) Date: Aug. 23, 2013

(87) PCT Pub. No.: WO2012/099068
PCT Pub. Date: Jul. 26, 2012

(65) Prior Publication Data
US 2013/0337202 A1 Dec. 19, 2013

(30) Foreign Application Priority Data
Jan. 17, 2011 (JP) ................. 2011-007300

(51) Int. Cl.
*H01L 21/673* (2006.01)
*C08L 25/04* (2006.01)
(Continued)

(52) U.S. Cl.
CPC ............ *H01L 21/673* (2013.01); *B32B 27/08* (2013.01); *B32B 27/302* (2013.01); *C08L 53/02* (2013.01);
(Continued)

(58) Field of Classification Search
CPC ....... B32B 27/06; B32B 27/08; B32B 27/302; H01L 21/673; C08L 53/02; C08L 25/06;
(Continued)

(56) References Cited

U.S. PATENT DOCUMENTS

| 4,540,623 | A | * | 9/1985 | Im | ........................... | B32B 27/08 |
| | | | | | | 264/173.12 |
| 2004/0048071 | A1 | * | 3/2004 | Kosugi | ................... | B32B 27/08 |
| | | | | | | 428/412 |

(Continued)

FOREIGN PATENT DOCUMENTS

| CN | 101186741 A | 5/2008 |
| EP | 2 626 203 A1 | 8/2013 |

(Continued)

OTHER PUBLICATIONS

Noshay et al., Block Copolymers: Overview and Critical Survey, New York: Academic, 1977.*

(Continued)

*Primary Examiner* — Lee E Sanderson
(74) *Attorney, Agent, or Firm* — Oliff PLC

(57) ABSTRACT

Disclosed are a multilayer styrenic resin sheet including 10 to 50 laminated layers which are each made of a styrenic resin composition that includes 29 to 65 mass % of a styrene/conjugated diene copolymer (A), 51 to 15 mass % of a polystyrene resin (B) and 20 to 9 mass % of an impact-resistant polystyrene resin (C) and which each have an average thickness of 2 to 50 μm; and a packaging material (such as carrier tape or tray) for electronic components which is formed from the multilayer styrenic resin sheet. The melt tension of the styrenic resin composition at 220° C. is preferably 10 to 30 mN, and the content of the conjugated diene is preferably 10 to 25 mass % relative to 100 mass % of the copolymer (A).

8 Claims, 1 Drawing Sheet

(51) Int. Cl.
  *C08L 53/02* (2006.01)
  *B32B 27/08* (2006.01)
  *B32B 27/30* (2006.01)

(52) U.S. Cl.
  CPC .... *H01L 21/67336* (2013.01); *B32B 2250/24* (2013.01); *B32B 2270/00* (2013.01); *B32B 2439/00* (2013.01); *B32B 2553/00* (2013.01); *B65D 2585/86* (2013.01); *C08L 2205/02* (2013.01); *Y10T 428/1352* (2015.01); *Y10T 428/24975* (2015.01)

(58) Field of Classification Search
  CPC ............... C08L 2205/025; C08L 25/04; Y10T 428/31855; Y10T 428/31909; Y10T 428/31931
  USPC ....... 428/35.7, 515; 524/232, 291, 300, 330, 524/474, 505, 571; 206/713
  See application file for complete search history.

(56) References Cited

U.S. PATENT DOCUMENTS

2006/0222794 A1* 10/2006 Hoshi .................... C08J 5/18
                                                            428/35.7
2009/0247700 A1* 10/2009 Ito ........................ C08F 297/04
                                                            525/93

FOREIGN PATENT DOCUMENTS

| | | |
|---|---|---|
| JP | A-2002-332392 | 11/2002 |
| JP | A-2003-55526 | 2/2003 |
| JP | A-2003-170547 | 6/2003 |
| JP | A-2003-253069 | 9/2003 |
| JP | A-2005-254711 | 9/2005 |
| JP | CN 101186741 A * | 5/2008 |
| JP | CN 101186741 B * | 12/2010 |
| WO | WO 2006/030871 A1 | 3/2006 |

OTHER PUBLICATIONS

Office Action issued in Chinese Patent Application No. 20128005627.5 dated Sep. 2, 2014 (with partial translation).
Extended Search Report issued in European Patent Application No. 12737118.5 dated Jun. 20, 2014.
International Search Report issued in International Patent Application No. PCT/JP2012/050739 dated Apr. 17, 2012.

* cited by examiner

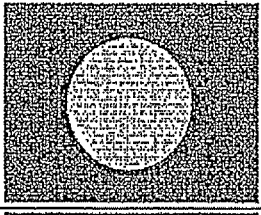

MULTILAYER STYRENIC RESIN SHEET

TECHNICAL FIELD

The present invention relates to a multilayer styrenic resin sheet suitable for use as a packaging material such as carrier tape for packaging electronic components including IC's.

BACKGROUND ART

As a packaging format for semiconductors and electronic components, especially integrated circuits (IC's) and electronic components using IC's, vacuum-formed trays and embossed carrier tapes obtained by thermoforming thermoplastic resin sheets are used. As embossed carrier tapes for housing electronic components with little possibility of being destroyed by electrostatic damage such as capacitors, embossed carrier tapes of transparent type using thermoplastic resins of relatively good transparency as base materials are used to enable the electronic components contained therein to be viewed from outside and because they are advantageous for sensing characters printed on the components. As examples of sheets for transparent-type embossed carrier tapes, mixed sheets of general-purpose polystyrene resin and styrene-conjugated diene block copolymers (see, e.g., Patent Documents 1 and 2) and sheets using MBS-type resins (see, e.g., Patent Document 3) have been proposed. Since carrier tapes using these sheets are transparent, they enable electronic components housed therein to be viewed from outside and characters printed on the components to be sensed, and they have come to be used in a wider range of applications in recent years.

However, as electronic components become smaller, the occurrence of flash or burrs on cut surfaces when slitting a raw material sheet to tape width or when punching sprocket holes or the like during embossment has become an important problem to be solved regarding the performance of carrier tapes and the like.

For the purpose of solving these problems, the blending of polyolefins, styrene-butadiene-styrene block copolymers, and styrene-ethylene-butylene-styrene block copolymers has been proposed (see, e.g., Patent Documents 4 and 5). While flash and burrs occurring due to slitting and punching of sprocket holes can sometimes be improved by taking such measures, almost no improvement is observed in some slitting methods and some molding equipment used for embossment, so further improvements have been sought.
Patent Document 1: JP-A 2003-055526
Patent Document 2: JP-A 2002-332392
Patent Document 3: JP-A 2003-253069
Patent Document 4: WO 2006/030871
Patent Document 5: JP-A2003-170547

SUMMARY OF THE INVENTION

The present invention has the purpose of offering a styrenic resin sheet with extremely rare occurrence of flash and burrs regardless of the slitting method or what kind of molding equipment is used for punching during embossment.

Additionally, the present invention has the purpose of offering an electronic component package such as an embossed carrier tape using such a sheet.

As a result of diligent research toward solving the aforementioned problems, the present inventors discovered that the occurrence of flash and burrs when slitting or punching sprocket holes can be greatly reduced by forming a styrenic resin composition of a specific composition into a multilayer sheet by stacking 10 or more layers.

In one aspect, the present invention offers a multilayer styrenic resin sheet comprising 10 to 50 stacked layers, each layer having an average thickness of 2 to 50 μm and being formed from a styrenic resin composition comprising 29 to 65 mass % of a styrene-conjugated diene block copolymer (A), 51 to 15 mass % of a polystyrene resin (B) and 20 to 9 mass % of a high impact polystyrene resin (C). The melt tension of this styrenic resin composition is preferably 10 to 30 mN at 220° C. Additionally, the proportion of conjugated diene blocks in 100 mass % of component (A) is preferably 10 to 25 mass %. Additionally, it is preferable that the peak molecular weight of the styrene blocks of component (A) as measured by GPC is in the range of 30,000 to 120,000, and a half-width of a molecular weight distribution curve of the styrene blocks is in the range of 0.8 to 1.25. Furthermore, it is preferable that the particle size of graft rubber in component (C) is 20 to 3.0 μm, and a rubber content of the graft rubber in the sheet is 0.75 to 1.90 mass %.

In another aspect; the present invention offers an electronic component package such as a carrier tape or a tray formed from the multilayer sheet.

According to the present invention, it is possible to obtain a multilayer styrenic resin sheet with extremely rare occurrence of flash and burrs regardless of the slitting method or what kind of molding equipment is used for punching during embossment, and by thermoforming the sheets, it is possible to obtain an electronic component package such as embossed carrier tape with almost no flash or burrs.

BRIEF DESCRIPTION OF THE DRAWINGS

The FIGURE shows examples of measuring microscope photographs showing the state of flash or burrs when punching a sheet.

MODES FOR CARRYING OUT THE INVENTION

The present inventors observed the conditions of burr occurrence when punching publicly known styrenic resin sheets and performed diligent research into methods for suppressing burr occurrence, as a result of which they discovered that a styrenic resin sheet with extremely rare occurrence of flash or burrs regardless of the type of molding equipment can be obtained by stacking 10 or more layers into multilayer form, each layer being formed from a resin composition comprising a styrene-conjugated diene block copolymer (A), a polystyrene resin (B), and a high impact polystyrene resin (C), preferably having the respective specific mass-average molecular weights described below.

The styrene-conjugated diene block copolymer (A) is a polymer comprising, in its structure, polymer blocks mainly composed of styrenic monomers and polymer blocks mainly composed of conjugated diene monomers. Examples of styrenic monomers include styrene, o-methylstyrene, p-methylstyrene, p-tert-butylstyrene, 1,3-dimethylstyrene, α-methylstyrene, vinylnaphthalene, vinylanthracene and 1,1-diphenylethylene. In a preferred embodiment of the present invention, styrene is the main component, but one or more of the above-described components other than styrene can be included as trace components.

Conjugated diene monomers are compounds having conjugated double bonds in their structure, examples of which include 1,3-butadiene (butadiene), 2-methyl-1,3-butadiene (isoprene), 2,3-dimethyl-1,3-butadiene, 1,3-pentadiene, 1,3- hexadiene and 2-methylpentadiene, among which butadiene and isoprene are preferable. The conjugated monomer may be of just one type or of two or more types. Polymer blocks mainly composed of styrenic monomers refer to both polymer blocks consisting only of structures derived from styrenic monomers and polymer blocks comprising structures derived from styrenic monomers by at least 50 mass %. Polymer blocks mainly composed of conjugated diene monomers refer to both polymer blocks consisting only of structures derived from conjugated diene monomers and polymer blocks comprising structures derived from conjugated diene monomers by at least 50 mass %. The conjugated diene block content of styrene-conjugated diene block copolymers (A) should preferably be 10 to 25 mass % out of 100 mass % of component (A) in view of the mechanical properties of the sheet. The conjugated diene block content here refers to the proportion of the mass of the entire copolymer occupied by structures derived from conjugated diene monomers.

Just one or two or more types of styrene-conjugated diene block copolymer (A) can be used. For the purposes of the present invention, a styrene-conjugated diene block copolymer, for example, when the conjugated diene is butadiene, may be either a styrene-butadiene (SB) bipolymer or a styrene-butadiene-styrene (SBS) terpolymer, and may be a resin composed of plural blocks with three or more styrene blocks and two or more butadiene blocks. Furthermore, it may have a so-called tapered block structure wherein the composition ratio of styrene and butadiene varies continuously between blocks. Additionally, the styrene-conjugated diene block copolymer may be one that is commercially available used directly as is.

The styrene-conjugated diene block copolymer (A) used in the present invention, as explained below, preferably has a styrene-converted mass-average molecular weight Mw of 80,000 to 220,000. The peak molecular weight of the styrene blocks in component (A) as measured by GPC is preferably in the range of 30,000 to 120,000, more preferably in the range of 40,000 to 110,000. Additionally, the half-width of the molecular weight distribution curve of the styrene blocks of component (A) is preferably in the range of 0.8 to 1.25, more preferably in the range of 1.05 to 1.25. By using blocks in this range, good moldability is obtained.

Here, the molecular weight distribution curve for styrene blocks in component (A) can be obtained in accordance with a GPC method by subjecting component (A) and the sheet to oxidative degradation by chloroform using osmium tetroxide as a catalyst, in accordance with the method described in I. M. Kolthoff, et al., *J. Polym. Sci.*, 4, 29 (1946), then dissolving the resulting styrene blocks in a tetrahydrofuran solvent. The molecular weight curve can then be used to determine the styrene-converted peak molecular weight using standard polystyrene (monodisperse). The GPC measurements may be made in accordance with conventional techniques, with the main measurement conditions being as follows:

Column temperature: 40° C.
Detection method: differential refractometry
Mobile phase: tetrahydrofuran
Sample concentration: 2 mass %
Calibration curve: from standard polystyrene (monodisperse)

The half-width can be determined using this molecular weight distribution curve for the styrene blocks. Specifically, when the molecular weight is placed on the horizontal axis using a logarithmic scale with the range of 1000 to 1,000,000 being 15 cm, and the concentration (mass ratio) is placed on the vertical axis at an arbitrary height, the width of the peak on the horizontal axis at a height of 50% of the peak top is the half-width. In this case, the height of the peak top should be that perpendicular to the horizontal axis, and the width of the peak at 50% of the height should be parallel to the horizontal axis. The half-width of the molecular weight distribution curve of the styrene blocks correlates with the molecular weight distribution of the block copolymer. While the method of adjusting the molecular weight distribution is not particularly restricted, block copolymers of different molecular weights can be obtained by methods such as adjusting the time of addition of the initiator during the polymerization of styrene block parts in component (A).

The polystyrene resin (B) is a resin generally known as a GPPS, mainly comprising styrenes as monomers, but may include one or more aromatic vinyl compounds such as o-methylstyrene, p-methylstyrene, p-tert-butylstyrene, 1,3-dimethylstyrene, α-methylstyrene, vinynaphthalene, vinylanthracene and 1,1-diphenylethylene as a trace component, and a commercially available resin may be used.

The high impact polystyrene resin (C) is a resin generally known as a HIPS, and is a polystyrene resin comprising microparticulate graft rubber to which styrenic monomers have been grafted. Examples of the rubber component in the graft rubber include, for example, dienic rubbers with 1,3-butadiene (butadiene), 2-methyl-1,3-butadiene (isoprene), 2,3-dimethyl-1,3-butadiene, 1,3-pentadiene, 1,3-hexadiene and 2-methylpentadiene as monomers. Additionally, a thermoplastic elastomer which is a styrene-conjugated diene block copolymer wherein the diene component takes up at least 50 mass % may be used. Among these, polybutadiene and styrene-butadiene block copolymers are preferred.

The graft rubber in component (C) excels in transparency when the particle size is in the range of at least 2.0 μm and at most 3.0 μm, preferably at least 2.3 μm and at most 2.7 μm. The graft rubber particle size here refers to the average particle size of the graft rubber component measured by a laser diffraction type particle analyzer. Additionally, in the sheet of the present invention, the graft rubber content derived from component (C) in the sheet when the sheet is defined as 100 mass % should preferably be 0.75 to 1.90 mass % in order to achieve balance between impact resistance and transparency of the sheet. The graft rubber content in component (C) and the proportional content of component (C) in the sheet should preferably be adjusted to put the graft rubber content of the sheet in the above-indicated ranges. Here, the graft rubber content in the component (C) can be determined by recovering the undissolved fraction after dissolving in a mixed solvent of MEK and acetone at a mass ratio of 50/50, and computing from the value of the mass thereof.

The resin sheet of the present invention is formed of a resin composition containing 29 to 65 mass % of component (A), 51 to 15 mass % of component (B), and 20 to 9 mass % of component (C), with (A) to (C) totaling 100 mass %. By setting the composition in these ranges, a sheet that is satisfactory in strength properties, impact resistance and transparency can be obtained.

The mass-average molecular weight (Mw) of each component (A) to (C) can be determined from a standard polystyrene-converted molecular weight distribution curve determined by conventional methods using GPC. As the mass-average molecular weight of the components (A) to (C) of the present invention, resins in the following ranges are used:

Component (A): Mw=80,000 to 220,000
Component (B): Mw=200,000 to 400,000

Component (C): Mw=150,000 to 210,000

By using resins in such ranges of mass-average molecular weight, not only does it become possible to adjust the appropriate range of melt tension fox this resin composition as described below, but also a sheet with a good balance of strength properties and transparency can be obtained, with very good moldability when thermoforming the resulting sheets into carrier tape or the like, enabling good pocket formation even for deep draw forming.

The melt tension in the present invention is the melt tension measured using a melt tension measuring device with an orifice diameter of 1.0 mmϕ, an orifice length of 10 mm, and windup speeds of 10, 30 and 50 m/minute. The melt tension at 220° C. of the resin composition comprising components (A) to (C) according to the present invention should preferably be 10 to 30 mN. If the melt tension is in these ranges, sheets with particularly good moldability when thermoforming the sheets into containers can be obtained. When the melt tension is less than 10 mN, holes may form when thermoforming the sheet, and when exceeding 30 mN, the formativeness (sharpness) of the pockets of the formed articles may be deficient. This melt tension can be adjusted within the range of 10 mN to 30 mN by adjusting the mass-average molecular weights of the components (A) to (C) and the proportional content of the components.

The resin sheet of multilayered structure according to the present invention is preferably composed of multiple layers of resin compositions comprising a styrene-conjugated diene block copolymer (A), a polystyrene resin (B) and a high-impact polystyrene resin (C), preferably having mass-average molecular weights in the respectively specific ranges describe above, but it also covers those in which the blending ratios of the components (A) to (C) are changed within the above-described composition range, with two types of styrenic resins stacked in alternation or three or more styrenic resins stacked in a predetermined pattern. Furthermore, various types of additives such as lubricants, plasticizers and processing aids can be added as needed to each layer.

The multilayer resin sheet of the present invention is a multilayered sheet formed from 10 to 50 separate layers respectively comprising resin compositions of the types and/or composition ratios of the components (A) to (C) varied within the ranges taught above, or preferably substantially the same types and composition ratios of resin components with an average thickness of 2 to 50 μm. Even if the individual layers are formed of the same components, a boundary still exists between each layer. While not more than conjecture, it is thought that when such a multilayered sheet is punched, even if a burr is formed due to stretching of the resin in one layer, the thinness of a single layer serves to limit the length of the burr, so the development of the burr stops at the boundary with the next layer, resulting in an effect of preventing problematic burrs. If the thickness of each layer is less than 2 μm, then the individual layers are too thin, so that the behavior of the entire sheet when pinched between a punching pin and a die is roughly the same as that for a single layer, and the burr limiting effect due to multiple layers is not obtained. Additionally, if 50 μm is exceeded, then the multilayer effects are lost, so that the burrs caused by stretching of the resin in the individual layers can become too long, and the occurrence of problematic burrs cannot be restrained. Furthermore, if there are less than 10 individual layers, then the burrs formed by stretching of resins generated from each layer can become too long as in the case when the thickness of each layer exceeds 50 μm, and if there are more than 50 layers, then the behavior of the entire sheet approximates that of a single layer as in the case where each layer is less than 2 μm thick, so that the multilayer effects cannot be obtained.

As described above, the multilayer sheet of the present invention uses a styrenic resin composition having a mass-average molecular weight in the specific ranges described above, resulting in a styrenic resin sheet with a high draw ratio (pocket depth) due to thermoforming, to be used in an electronic component package such as embossed carrier tape capable of forming pockets with excellent transparency and strength. By thermoforming this sheet, a carrier tape enabling characters or the like printed on contained electronic components to be viewed from outside the pockets can be obtained. At the same time, by using a laminated structure of said resin, an effect of preventing the occurrence of rollover and exit burrs in the resins during cutting and punching processes is obtained, enabling a reduction in the occurrence of flash and burrs due to processing.

The multilayer styrenic resin sheet of the present invention can be produced using methods similar to the methods for producing normal laminated sheets, basically, by supplying a resin for forming the sheet of multilayered structure to an extruder and melt-kneading, then supplying to a feed block and stacking multiple layers to form a multilayered sheet by extrusion.

In this case, when the substrate sheet of multilayered structure of the present invention, as described above, is a structure formed by stacking 10 to 50 separate layers preferably substantially of the same type and composition ratio, the aforementioned styrenic resin composition can basically be melt-extruded with a single extruder. In that case, for example, when the melt-flow is close to laminar flow, multiple layers can be formed by inserting a static mixer with a specific number of elements between the extruder and the die.

On the other hand, in general, or when using, for example, two resins with different types of resin components and/or composition ratios, as described for example in JP-A 2007-307893, the styrenic resins can be supplied from two extruders and the melted resins from each flow route formed into multiple layers using a multimanifold type feed block and a square mixer which are publicly known laminating devices, or by using a comb-type feed block to form 10 to 50 layers. Additionally, by increasing the number of extruders, three or more types of resins may be used. Here, a square mixer refers to a publicly known tube element that divides a polymer flow route into two flow routes of rectangular cross section, and further comprises a merging portion for recombining the branched polymers so as to be stacked top to bottom in the thickness direction. In another method, the flow route of melted resin extruded from one extruder can be separated into two by publicly known means, and supplied to a feed block by respectively separate flow routes to form multiple layers by a method similar to that using two extruders described above.

By using a publicly known sheet forming method (thermoforming) such as vacuum forming, pressure forming and press forming on the multilayered sheet of the present invention, electronic component packaging containers (electronic component packages) of various forms such as carrier tapes (embossed carrier tape) and trays can be obtained. By using the multilayered sheet of the present invention, it is possible to obtain a packaging container with very little occurrence of flash and burrs on the cross section when slitting the multilayered sheet or punching sprocket holes or the like to form electronic component packaging containers as described above. It is particularly effective for embossment of carrier tape. By using such forming and secondary processing, an embossed carrier tape excelling in dimensional precision such as slit width and punching hole size and significantly reducing the occurrence of burrs during punching can be produced.

More specifically, in the secondary processing steps of slitting and punching of embossed carrier tape and the like in the present invention, sprocket holes of stable hole size and markedly suppressed occurrence of flash and burrs can be obtained by punching conditions over a standard wide range of unilateral pin/die clearance of 5 to 50 μm and a punching speed of 10 to 300 mm/sec. Additionally, slitting processes using ring-shaped combination blades also result in slit end surfaces with little flash and burrs, and stable sheet width.

The embossed carrier tape of the present invention can be used to store and transport electronic components after housing the electronic components inside receiving portions formed with the aforementioned forming methods, forming a lid by means of cover tape, and winding into a reel to form a carrier tape body.

EXAMPLES

While the present invention will be specifically explained using examples, the present invention is not to be construed as being limited by the descriptions of these examples.

First, the raw material resins used as components (A) to (C) in the present examples are shown together with their properties on Table 1, and the methods for evaluation of the properties used in the present examples shall be explained.
<Raw Material Resin>

TABLE 1

| | | Mass Average Molecular Weight | Conjugated Diene Block Content (mass %) | Styrene Block Peak Molecular Weight | Styrene Block Peak Half-Width (cm) |
|---|---|---|---|---|---|
| Styrene-Conjugated Diene Block Copolymer (A) | A-1 | 150,000 | 20 | 40,000 | 1.11 |
| | A-2 | 140,000 | 24 | 109,000 | 0.94 |

| | | Mass Average Molecular Weight | | |
|---|---|---|---|---|
| Polystyrene (B) | B-1 | 330,000 | | |
| | B-2 | 290,000 | | |

| | | Mass Average Molecular Weight | Graft Rubber Particle Size (μm) | Graft Rubber Content (mass %) |
|---|---|---|---|---|
| High Impact Polystyrene (C) | C-1 | 180,000 | 2.5 | 8.6 |
| | C-1 | 190,000 | 2.0 | 7.9 |

<Evaluation Method>
(1) Evaluation of Properties of Raw Material Resin
(1-1) Molecular Weight Measurement The molecular weights of the raw material resins were determined as a standard polystyrene-converted mass-average molecular weight (Mw) using GPC (gel permeation chromatography). The GPC measurements were performed under the following conditions.

Column temperature: 40° C.
Detection method: differential refractometry
Mobile phase: tetrahydrofuran
Sample concentration: 2 mass %
Calibration curve: from standard polystyrene (Polymer Laboratories)

(1-2) Evaluation of Peak Molecular Weight and Molecular Weight Distribution Peak Width of Styrene Blocks of Styrene-Conjugated Diene Block Copolymer (A)

The block styrene contents for the resins and sheets of component (A) used in each example and comparative example were measured by a method of oxidative degradation by tertiary butyl hydroperoxide using osmium tetroxide as a catalyst (the method described in I. M. Kolthoff, et al., *J. Polym. Sci.*, 1, 429 (1946)). The styrene block portion of the resulting component (A) was dissolved in a tetrahydrofuran solvent, and a chromatochart of the molecular weight distribution was obtained by a conventional method using gel permeation chromatography (GPC). The peak molecular weight was determined by taking GPC measurements of standard polystyrene (monodisperse) for use in GPC to form a calibration curve of the peak count and number average molecular weight of the standard polystyrene, then reading peak molecular weights from the measured chromatochart.

The molecular weights on the molecular weight distribution chart from which the above-described peak molecular weights were determined were placed on a horizontal axis using a logarithmic scale with the range of 1000 to 1,000,000 being 15 cm, and the width (in cm) of the peak on the horizontal axis at a height of 50% of the peak top was determined.

(2) Punchability Evaluation

Multilayer sheets made from the examples and comparative examples were formed using a vacuum rotary embossed carrier tape former (CKD CTF-200). During the forming step, the punching of each sprocket hole in the embossed carrier tape was performed in the following range of conditions.

(Punching Conditions)
Pin/die clearance: 1-50 μm unilaterally
Punching speed: 10 to 300 mm/sec Next, the sprocket holes of each sample were photographed under 30× magnification with a measuring microscope (Mitsutoyo MF-A), and the photographs were image-processed to quantify the rate of occurrence of flash and burrs. The method of quantification involved binarizing (forming a black/white image) the taken photograph with image editing software (Adobe Photoshop), and counting the number of pixels of the punched hole portions. The proportion of flash and burrs covering a punched hole was calculated by computing the proportion of the number of pixels of the punched hole portion of each sample to the number of pixels of a perfect circle of a predetermined hole diameter without any flash or burrs. Observation of the punched holes was performed ten times for each sample, and the average value was defined as the burr occurrence rate.

(3) Evaluation of Pin/Die Clearance with Optimum Punching Conditions

The ranges over which a burr occurrence rate of 4% or less was obtained for the above punchability evaluation under conditions of a unilateral punching pin/die clearance (1-50 μm) and punching speed of 10-300 mm/sec were observed in order to evaluate the range of conditions in the punching process (processing window). The burr occurrence rate in the examples and comparative examples was smallest for all clearance conditions at a punching speed of 250 mm/sec.

(4) Punched Hole Size Evaluation

In the above punchability evaluations, the dimensions of thirty punched sprocket holes (target value φ1.5 mm) were measured using a measuring microscope (Mitsutoyo MF-A), to evaluate the range of variation of the hole size.

(5) Slittability Evaluation

Slitting was performed using a ring-shaped combination blade of a vacuum rotary embossed carrier tape former (CKD CTF-200), the slit end surfaces were observed under magnification with a measuring microscope, and they were compared for the presence or absence of flash and burrs. A state of almost complete absence of flash and burrs was rated "excellent", presence of those less than 1.0 mm long was rated "good", and presence of those at least 1.0 mm long was rated "fall".

Example 1

A multilayered sheet was prepared by the below-described method using a multilayered sheet forming device comprising a feed block, square mixer and T-die.

A-1 was used as the styrene-conjugated diene block copolymer (A), B-1 was used as the polystyrene resin (B) and C-1 was used as the high impact polystyrene resin (C), these being dry-blended with the blending ratios shown in Table 2 and melt-kneaded in a φ65 mm uniaxial extruder. Next, ten layers of the same melted resin were stacked using a feed block and square mixer on the flow route, spread into a sheet using a T-die, and cool-solidified using a roller adjusted to 80° C. to form a multilayered sheet. The total thickness of the resulting sheet was 200 pin (average thickness per layer: 20 μm).

Examples 2 and 3

Multilayered sheets of total thickness 200 μm (average thickness per layer: 6.7 μm and 4 μm) were formed in the same manner as Example 1, except that the number of layers was set respectively to 30 layers and 50 layers.

Example 4

A multilayered sheet was formed in the same manner as Example 1, except that the average thickness per layer was 40 μm and the total thickness of the multilayered sheet was 400 μm.

Example 5

A multilayered sheet was formed in the same manner as Example 2 (30 layers), except that the component ratios of A-1, B-1 and C-1 were set to the values described in Table 2.

Example 6

A multilayered sheet was formed in the same manner as Example 2 (30 layers), except that the components of A-2, B-2 and C-2 were used in the component ratios described in Table 2 as the raw material resins.

The evaluation results of the sheets of Examples 1-6 are shown in summary in Table 3. Additionally, the FIGURE shows a measuring microscope photograph of Example 2 when punched with a unilateral pin/die clearance of 20 μm and a punching speed of 250 mm/sec.

TABLE 2

|  |  | Ex 1-4 Comp Ex 1-3 | Ex 5 | Ex 6 | Comp Ex 4 | Comp Ex 5 | Comp Ex 6 |
| --- | --- | --- | --- | --- | --- | --- | --- |
| Styrene-Conjugated Diene Block Copolymer (A) | A-1 | 58 | 35 |  | 28 | 82 | 75 |
|  | A-2 |  |  | 58 |  |  |  |
| Polystyrene (B) | B-1 | 33 | 45 |  | 63 | 9 | 20 |
|  | B-2 |  |  | 33 |  |  |  |
| High Impact Polystyrene (C) | C-1 | 9 | 20 |  | 9 | 9 | 5 |
|  | C-2 |  |  | 9 |  |  |  |
| Graft Rubber Content (mass %) |  | 0.77 | 1.72 | 0.71 | 0.77 | 0.77 | 0.43 |
| Melt tension (10 m/min) | mN | 18 | 22 | 18 | 32 | 15 | 14 |
| Melt tension (30 m/min) |  | 20 | 26 | 20 | 34 | 16 | 16 |
| Melt tension (50 m/min) |  | 21 | 27 | 21 | 35 | 17 | 17 |

TABLE 3

|  | Ex 1 | Ex 2 | Ex 3 | Ex 4 | Ex 5 | Ex 6 |
| --- | --- | --- | --- | --- | --- | --- |
| Total number of styrenic resin layers | 10 | 30 | 50 | 10 | 30 | 30 |
| Average thickness per layer (μm) | 20 | 6.7 | 4.0 | 40 | 6.7 | 6.7 |
| Total sheet thickness (μm) | 200 | 200 | 200 | 400 | 200 | 200 |
| Burr occurence rate (%) | 3.9 | 3.7 | 3.5 | 3.8 | 3.2 | 3.7 |
| Optimum punching condition Unilateral pin/die clearance (μm) | 10-20 | 5-20 | 5-20 | 30-40 | 5-20 | 5-20 |
| Punched hole size stability (error) | ±0.10 | ±0.10 | ±0.10 | ±0.10 | ±0.10 | ±0.10 |
| Slittability evaluation | good | excel | excel | good | excel | excel |

Comparative Examples 1-3

Multilayered sheets were formed in the same manner as Example 1, except that the number of layers were respectively one layer, six layers and 120 layers, and the average thickness per layer was changed as shown in Table 4.

Comparative Examples 4-6

Multilayered sheets were formed in the same manner as Example 2 (30 layers), except that the component ratios of A-1, B-1 and C-1 were set to the values described in Table 2.

The results of evaluations of sheets according to these Comparative Examples 1-6 are shown in Table 4. Additionally, the FIGURE shows a measuring microscope photograph of Comparative Example 1 when punched with a unilateral pin/die clearance of 20 μm and a punching speed of 250 mm/sec. In Comparative Example 4, a sheet was not able to be obtained because a film could not be formed due to the brittleness of the materials. Additionally, the sheet of Comparative Example 5 had poor sheet smoothness, resulting in winding defects that prevented the sheet from being wound, so the sheet could not be evaluated.

TABLE 4

|  | Comp Ex 1 | Comp Ex 2 | Comp Ex 3 | Comp Ex 4 | Comp Ex 5 | Comp Ex 6 |
| --- | --- | --- | --- | --- | --- | --- |
| Total number of styrenic resin layers | 1 | 6 | 120 | 30 | 30 | 30 |
| Average thickness per layer (μm) | 200 | 33 | 1.7 | no | no | 6.7 |
| Total sheet thickness (μm) | 200 | 200 | 200 | film, | data, | 200 |
| Burr occurence rate (%) | 6.9 | 6.5 | 6.2 | too | could | 5.8 |
| Optimum punching condition | none | none | none | brittle | not | none |
| Unilateral pin/die clearance (μm) |  |  |  |  | wind |  |
| Punched hole size stability (error) | ±0.15 | ±0.15 | ±0.15 |  |  | ±0.15 |
| Slittability evaluation | fail | fail | fail |  |  | fail |

The invention claimed is:

1. A multilayer styrenic resin sheet comprising 10 to 50 stacked layers, each and every layer having an average thickness of 4 to 40 μm and being formed from a styrenic resin composition comprising 35 to 58 mass % of a styrene-conjugated diene block copolymer (A), 33 to 45 mass % of a polystyrene resin (B) and 9 to 20 mass % of a high impact polystyrene resin (C), wherein a peak molecular weight of the styrene blocks of component (A) as measured by GPC is in the range of 30,000 to 120,000, and a half-width of a molecular weight distribution curve of the styrene blocks is in the range of 0.8 to 1.25, a proportion of conjugated diene blocks in 100 mass % of component (A) is 10 to 25 mass %, and each and every layer of the multilayer styrenic resin sheet is formed from substantially the same styrenic resin composition.

2. The multilayer styrenic resin sheet recited in claim 1, wherein the styrenic resin composition has a melt tension of 10 to 30 mN at 220° C.

3. The multilayer styrenic resin sheet recited in claim 1, wherein an average particle size of graft rubber in component (C) is 2.0 to 3.0 μm, and a rubber content of graft rubber in the sheet is 0.75 to 1.90 mass %.

4. An electronic component package formed from the multilayer styrenic resin sheet recited in claim 1.

5. The electronic component package recited in claim 4, which is a carrier tape.

6. The electronic component package recited in claim 4, which is a tray.

7. The multilayer styrenic resin sheet recited in claim 1, wherein the styrene-conjugated diene block copolymer (A) is a resin composed of plural blocks with three or more styrene blocks and two or more butadiene blocks.

8. The multilayer styrenic resin sheet recited in claim 1, wherein the styrene-conjugated diene block copolymer (A) has a tapered block structure, wherein a composition ratio of styrene and butadiene varies continuously between blocks.

* * * * *